US012665547B2

(12) United States Patent
Nomiya

(10) Patent No.: US 12,665,547 B2
(45) Date of Patent: Jun. 23, 2026

(54) INTEGRATED CIRCUIT DEVICE AND OSCILLATOR

(71) Applicant: SEIKO EPSON CORPORATION, Tokyo (JP)

(72) Inventor: Takashi Nomiya, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 19/065,397

(22) Filed: Feb. 27, 2025

(65) Prior Publication Data

US 2025/0274079 A1 Aug. 28, 2025

(30) Foreign Application Priority Data

Feb. 28, 2024 (JP) ................................. 2024-028240

(51) Int. Cl.
| | |
|---|---|
| *H03B 5/04* | (2006.01) |
| *H03B 1/02* | (2006.01) |
| *H03B 5/32* | (2006.01) |
| *H03B 5/36* | (2006.01) |
| *H03L 1/02* | (2006.01) |
| *H03L 1/04* | (2006.01) |
| *H10W 72/90* | (2026.01) |

(52) U.S. Cl.
CPC ................. *H03B 5/04* (2013.01); *H03B 1/02* (2013.01); *H03B 5/32* (2013.01); *H03B 5/36* (2013.01); *H03L 1/028* (2013.01); *H03L 1/04* (2013.01); *H10W 72/932* (2026.01)

(58) Field of Classification Search
CPC ... H03B 5/04; H03B 5/32; H03B 5/36; H03B 1/02; H03L 1/02; H03L 1/028; H03L 1/04; H10W 72/932; H10W 72/90
See application file for complete search history.

(56) References Cited

U.S. PATENT DOCUMENTS

| | | | |
|---|---|---|---|
| 2012/0161889 A1* | 6/2012 | Ozawa ................... | H03B 5/364 |
| | | | 331/116 FE |
| 2016/0020789 A1* | 1/2016 | Ito ......................... | H04L 27/152 |
| | | | 375/297 |
| 2022/0239299 A1* | 7/2022 | Ito ........................... | H03B 5/04 |
| 2023/0246593 A1* | 8/2023 | Il ............................. | H03B 5/36 |

FOREIGN PATENT DOCUMENTS

| | | |
|---|---|---|
| JP | 2012-124630 A | 6/2012 |
| JP | 2022-113188 A | 8/2022 |

* cited by examiner

*Primary Examiner* — Ryan Johnson
(74) *Attorney, Agent, or Firm* — Harness, Dickey & Pierce, P.L.C.

(57) ABSTRACT

An integrated circuit device includes a clock input terminal disposed along a first side, to which a reference clock signal is input, a first power supply voltage input terminal disposed along the first side, to which a first power supply voltage is input, a clock output terminal disposed along the second side, from which an output clock signal having a frequency different from that of the reference clock signal is output, a second power supply voltage input terminal disposed along the second side, to which a second power supply voltage is input, a first ground terminal disposed between the clock input terminal and the first power supply voltage input terminal along the first side, and a second ground terminal disposed between the clock output terminal and the second power supply voltage input terminal along the second side.

11 Claims, 8 Drawing Sheets

*FIG. 1*

FIG. 8
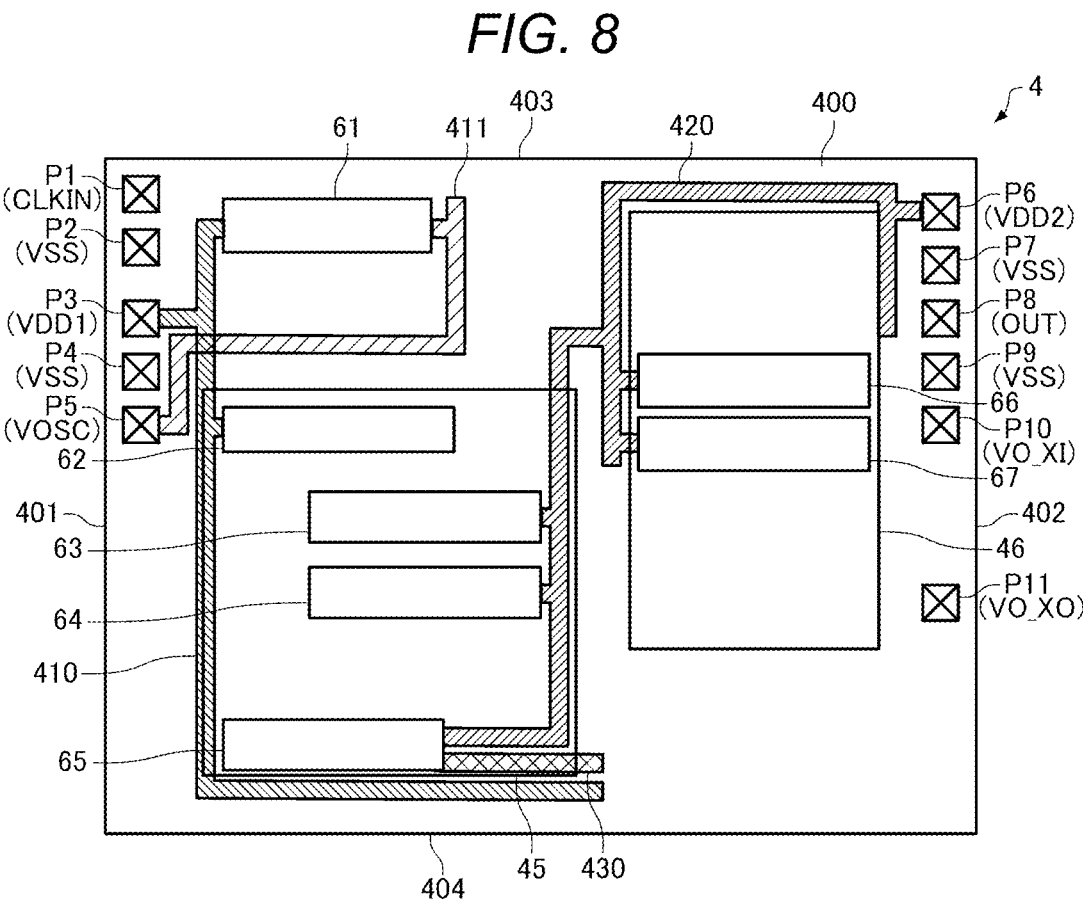
FIG. 9
P1 (CLKIN)
P3 (VDD1)
I2
I1
P2 (VSS)
I3
FIG. 10
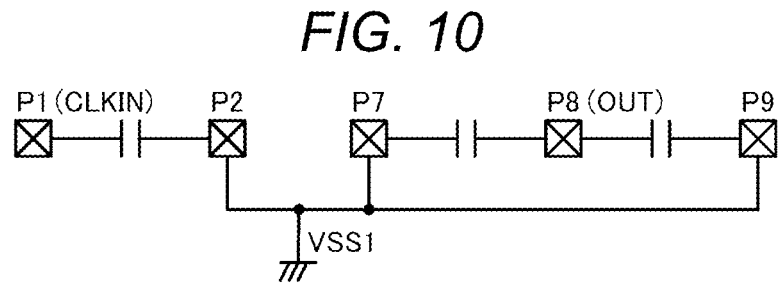

INTEGRATED CIRCUIT DEVICE AND OSCILLATOR

The present application is based on, and claims priority from JP Application Serial Number 2024-028240, filed Feb. 28, 2024, the disclosure of which is hereby incorporated by reference herein in its entirety.

BACKGROUND

1. Technical Field

The present disclosure relates to an integrated circuit device and an oscillator.

2. Related Art

JP-A-2012-124630 discloses an integrated circuit in which power supply pads that supply a power supply voltage to an integer division circuit, a decimal division circuit, a phase comparator, and a charge pump are separately provided in a fractional frequency division PLL circuit, and thereby, coupling of frequency components that cause spurious via a power supply line is prevented.

JP-A-2012-124630 is an example of the related art.

In the integrated circuit disclosed in JP-A-2012-124630, interference noise propagating in the PLL circuit can be suppressed, however, an effect of suppressing interferences via terminals is not expected.

SUMMARY

An integrated circuit device according to an aspect of the present disclosure having a first side and a second side as an opposite side to the first side in a plan view, includes a clock input terminal disposed along the first side, to which a reference clock signal is input, a first power supply voltage input terminal disposed along the first side, to which a first power supply voltage as a source of a power supply voltage supplied to a first circuit that operates at a frequency of the reference clock signal is input, a clock output terminal disposed along the second side, from which an output clock signal having a frequency different from that of the reference clock signal is output, a second power supply voltage input terminal disposed along the second side, to which a second power supply voltage as a source of a power supply voltage supplied to a second circuit that operates at the frequency of the output clock signal is input, a first ground terminal disposed between the clock input terminal and the first power supply voltage input terminal along the first side, and a second ground terminal disposed between the clock output terminal and the second power supply voltage input terminal along the second side.

An oscillator according to an aspect of the present disclosure includes the integrated circuit device according to the aspect.

BRIEF DESCRIPTION OF THE DRAWINGS

FIG. 1 is a cross-sectional view of an oscillator of an embodiment.

FIG. 8 shows a layout configuration of a control IC in the first embodiment.

FIG. 9 shows electromagnetic field coupling.

FIG. 10 shows capacitive coupling in the first embodiment.

DESCRIPTION OF EMBODIMENTS

As below, preferred embodiments of the present disclosure will be described in detail using the drawings. Note that the embodiments to be described below do not unduly limit the present disclosure described in What is Claimed is. In addition, not all configurations to be described below are necessarily essential component elements of the present disclosure.

1. First Embodiment 1-1. Configuration of Oscillator

Figure 1:
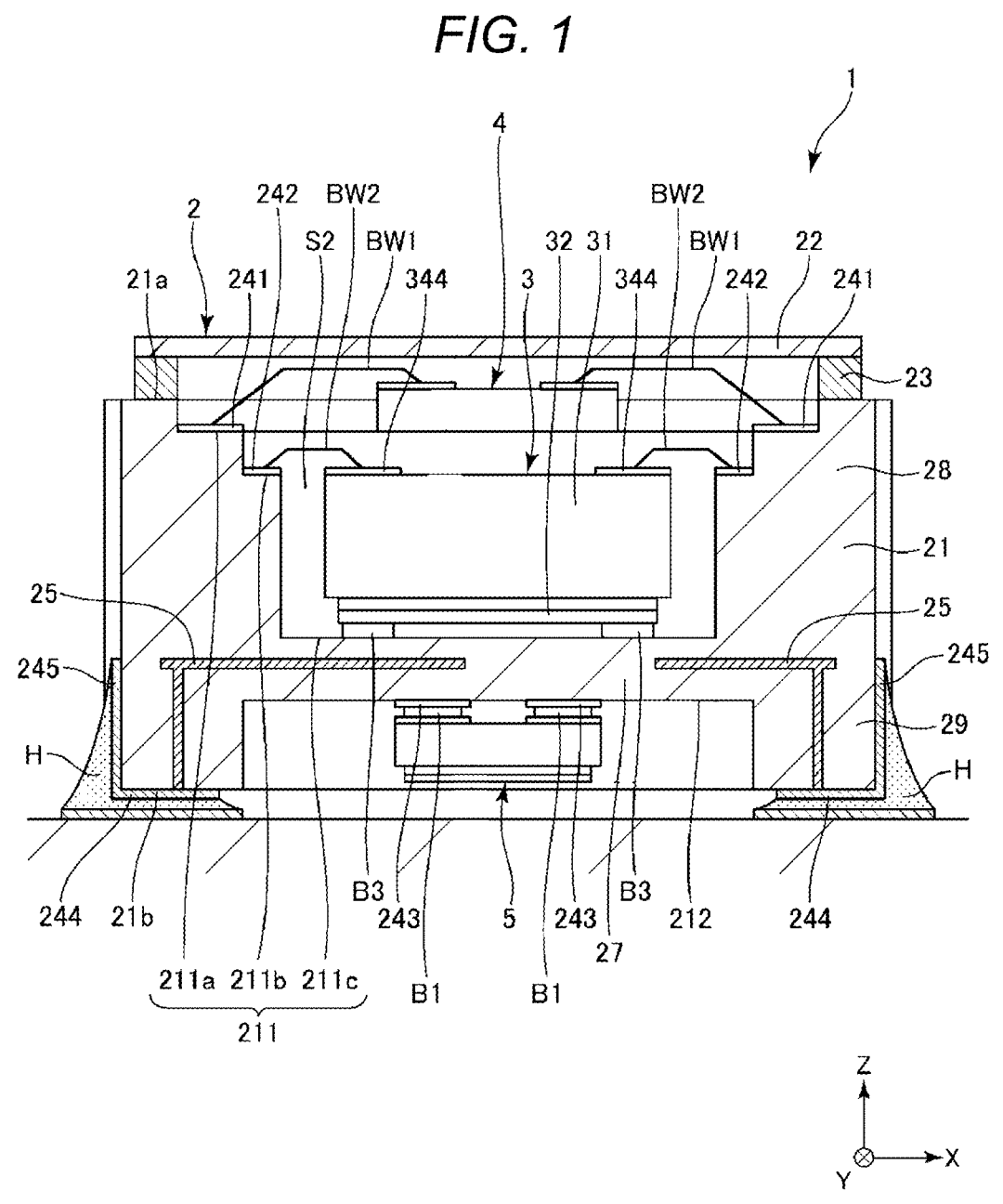
Figure 2:
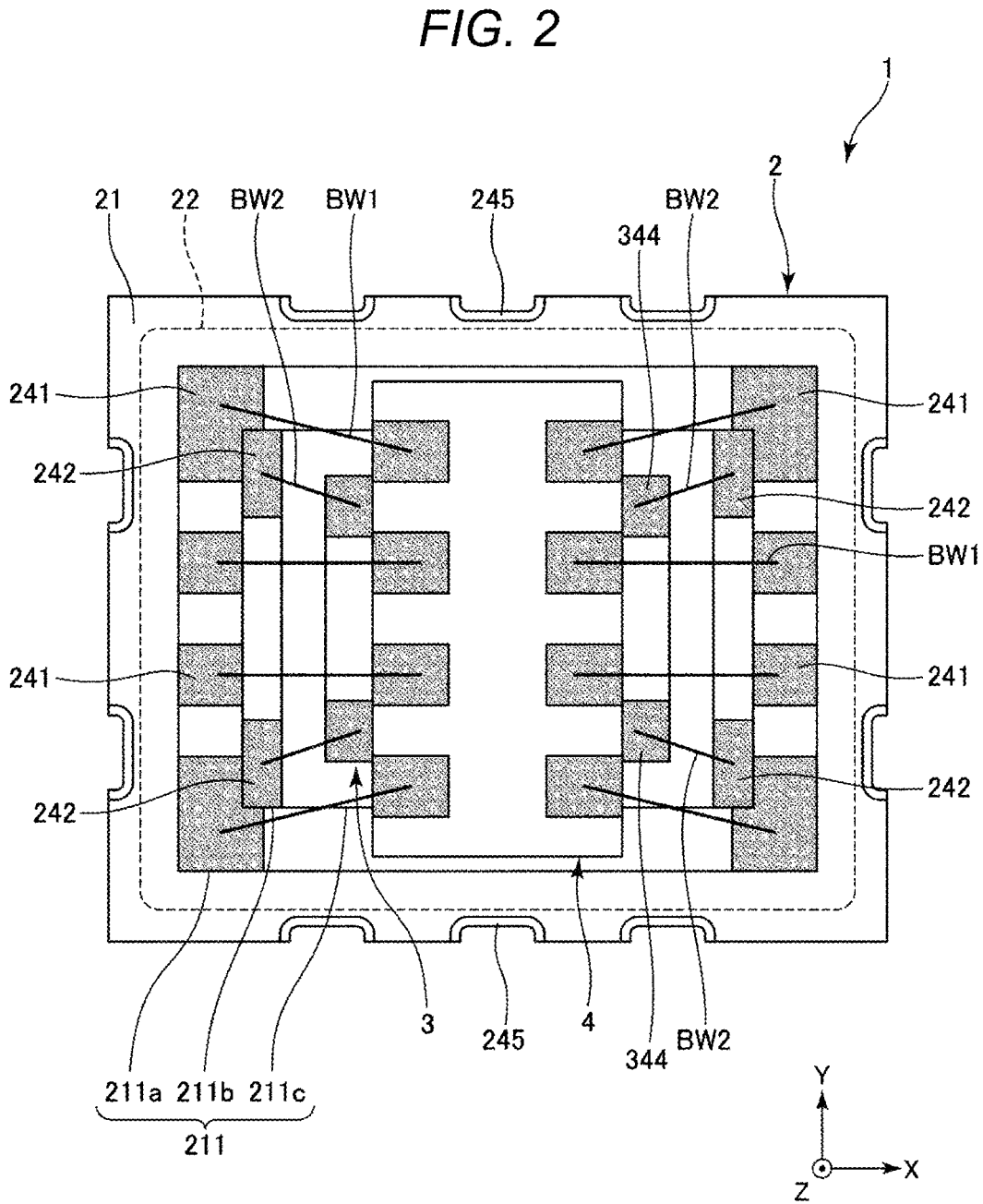
FIG. 2 is a plan view of the oscillator of the embodiment.
Figure 3:
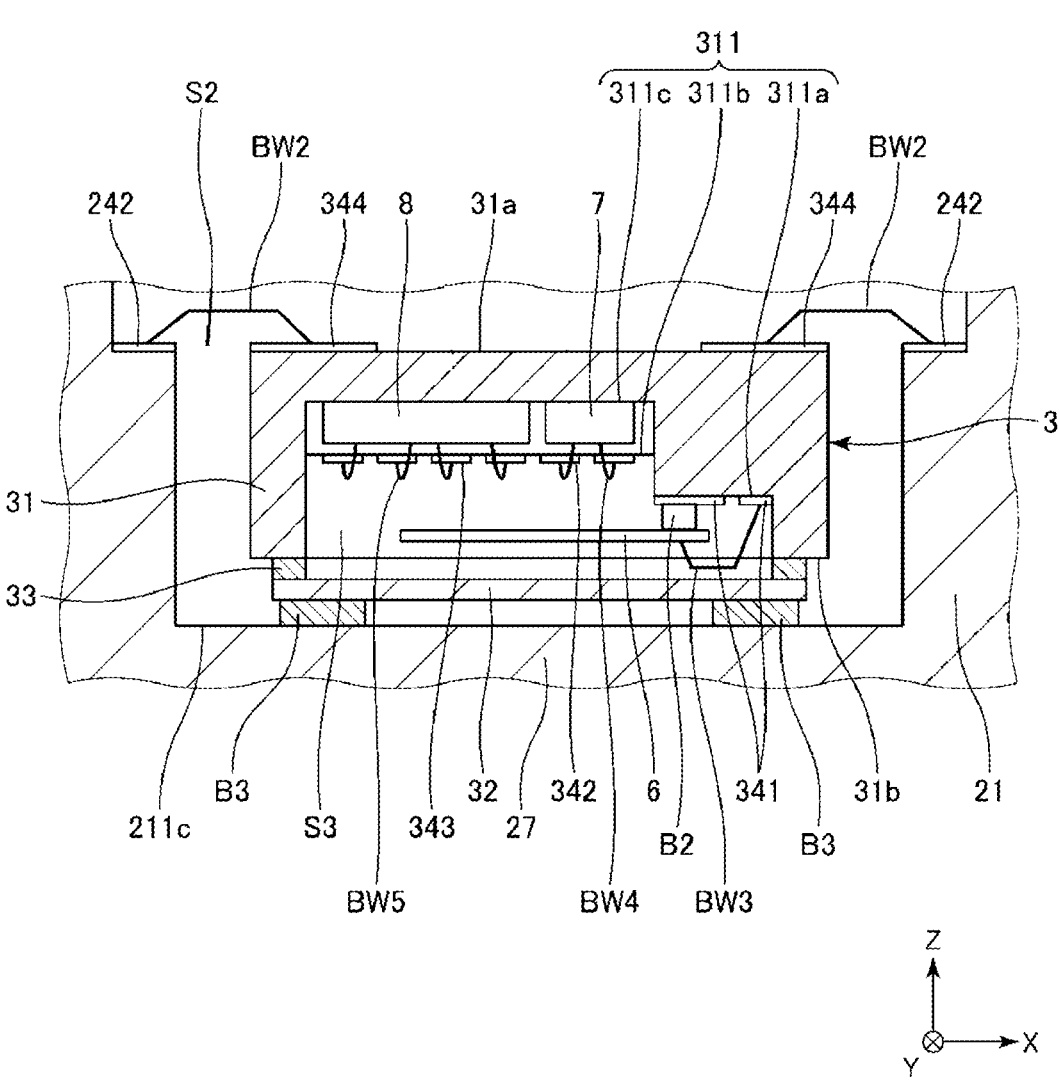
FIG. 3 is a cross-sectional view showing an inner package of the oscillator and the inside thereof.
Figure 4:
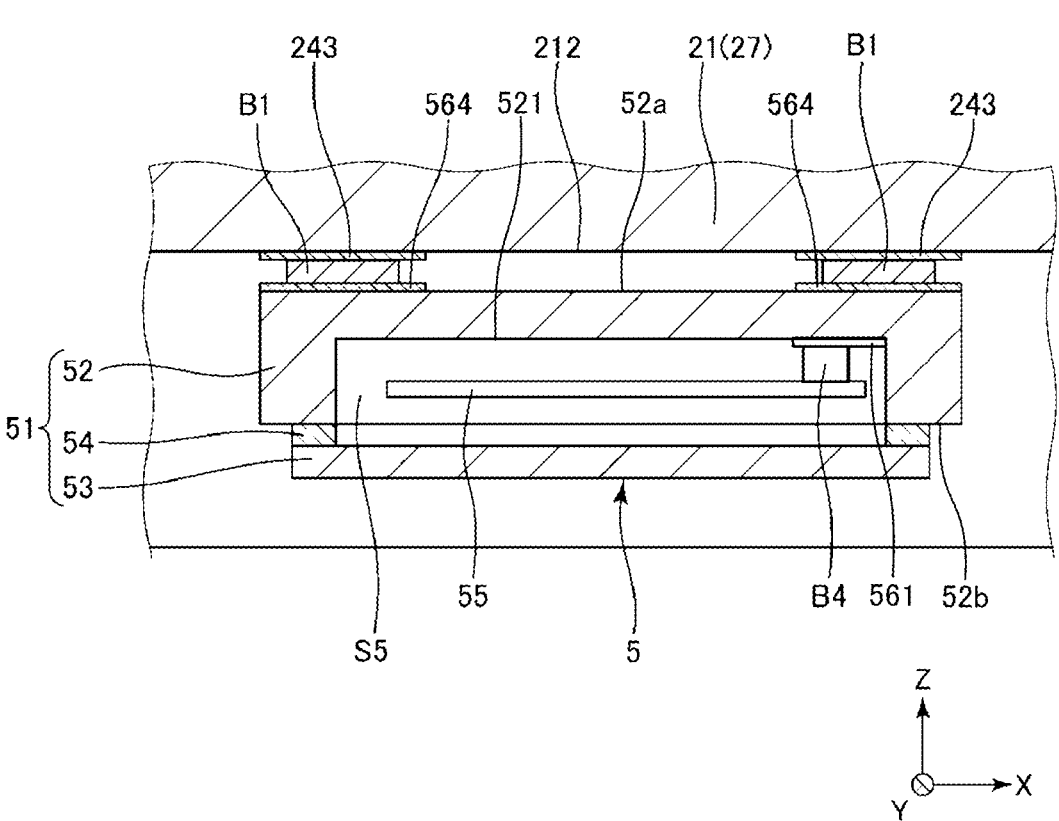
FIG. 4 is a cross-sectional view showing a resonator of the oscillator.

FIG. 1 is a cross-sectional view showing an oscillator of an embodiment. FIG. 2 is a plan view of the oscillator as seen from above. FIG. 3 is a cross-sectional view showing an inner package of the oscillator and the inside thereof. FIG. 4 is a cross-sectional view showing a resonator of the oscillator.

An oscillator 1 shown in FIGS. 1 and 2 is an oven-controlled crystal oscillator, and includes an outer package 2, an inner package 3, a control IC 4, and a resonator 5. The inner package 3, the control IC 4, and the resonator 5 are housed in the outer package 2.

As shown in FIG. 1, the outer package 2 includes an outer base 21 and an outer lid 22. The outer base 21 includes a board 27, a frame-shaped wall portion 28 standing upward from an edge portion of an upper surface of the board 27, and a frame-shaped leg portion 29 standing downward from an edge portion of a lower surface of the board 27. The upper surface of the board 27 and the wall portion 28 form an upper recess 211 that opens in an upper surface 21a of the outer base 21, and the lower surface of the board 27 and the leg portion 29 form a lower recess 212 that opens in a lower surface 21b of the outer base 21. Therefore, the outer base 21 has a substantially H-shaped cross section.

The upper recess 211 includes a first upper recess 211a that opens in the upper surface 21a, a second upper recess 211b that opens in a bottom surface of the first upper recess 211a and has an opening smaller than that of the first upper recess 211a, and a third upper recess 211c that opens in a bottom surface of the second upper recess 211b and has an opening smaller than that of the second upper recess 211b. The control IC 4 is disposed at the bottom surface of the first upper recess 211a, and the inner package 3 is disposed at a bottom surface of the third upper recess 211c.

The outer lid 22 is bonded to the upper surface 21a of the outer base 21 via a sealing member 23 such as a seal ring or low-melting-point glass to close the opening of the upper recess 211. Accordingly, the upper recess 211 is hermetically sealed, and an outer housing space S2 as a housing space is formed in the outer package 2. Meanwhile, the opening of the lower recess 212 is not sealed and faces the outside of the outer package 2. The inner package 3 and the control IC 4 are housed in the outer housing space S2, and the resonator 5 is disposed at the lower recess 212.

The outer base 21 includes a plurality of internal terminals 241 disposed at the bottom surface of the first upper recess 211a, a plurality of internal terminals 242 disposed at the bottom surface of the second upper recess 211b, a plurality of internal terminals 243 disposed at a bottom surface of the lower recess 212, and a plurality of external terminals 244 disposed at the lower surface 21b, that is, a top surface of the leg portion 29. Each internal terminal 241 is electrically coupled to the control IC 4 via a bonding wire BW1, each internal terminal 242 is electrically coupled to the inner package 3 via a bonding wire BW2, and each internal terminal 243 is electrically coupled to the resonator 5 via a conductive bonding member B1.

The respective terminals 241, 242, 243, and 244 are electrically coupled as appropriate through internal wiring 25 formed in the outer base 21 to electrically couple the control IC 4, the inner package 3, the resonator 5, and the external terminals 244. The internal wiring 25 is coupled to the external terminals 244 through the inside of the leg portion 29. In the external terminals 244, coupling to an external apparatus (not shown) is made. A side surface terminal 245 coupled to the external terminal 244 is disposed at a side surface of the leg portion 29. The side surface terminal 245 is a castellation. Therefore, solder H spreads over the side surface terminal 245 to form a fillet, and thus mechanical and electrical bonding with the external apparatus becomes stronger. However, the configuration is not limited thereto, and for example, the side surface terminal 245 may be omitted.

As shown in FIG. 3, the inner package 3 includes an inner base 31 and an inner lid 32. The inner base 31 has a recess 311 that opens in a lower surface 31b.

The recess 311 includes a first recess 311a that opens in the lower surface 31b, a second recess 311b that opens in a bottom surface of the first recess 311a and has an opening smaller than that of the first recess 311a, and a third recess 311c that opens in a bottom surface of the second recess 311b and has an opening smaller than that of the second recess 311b. A resonator element 6 is disposed at the bottom surface of the first recess 311a, and a heat generation IC 7 and an oscillation IC 8 are disposed side by side in an X-axis direction at a bottom surface of the third recess 311c.

The inner lid 32 is bonded to the lower surface 31b of the inner base 31 via a sealing member 33 such as a seal ring or low-melting-point glass to close the opening of the recess 311. Accordingly, the recess 311 is hermetically sealed, and an inner housing space S3 is formed in the inner package 3. The resonator element 6, the heat generation IC 7, and the oscillation IC 8 are housed in the inner housing space S3.

The inner housing space S3 is airtight and in a reduced pressure state, and is preferably in a state closer to vacuum. Accordingly, viscous resistance in the inner housing space S3 is reduced, and a vibrational characteristic of the resonator element 6 is improved. However, the atmosphere in the inner housing space S3 is not particularly limited.

The inner base 31 includes a plurality of internal terminals 341 disposed at the bottom surface of the first recess 311a, a plurality of internal terminals 342 and 343 disposed at the bottom surface of the second recess 311b, and a plurality of external terminals 344 disposed at an upper surface 31a of the inner base 31. Each internal terminal 341 is electrically coupled to the resonator element 6 via a conductive bonding member B2 and a bonding wire BW3, each internal terminal 342 is electrically coupled to the heat generation IC 7 via a bonding wire BW4, and each internal terminal 343 is electrically coupled to the oscillation IC 8 via a bonding wire BW5.

The terminals 341, 342, 343, and 344 are electrically coupled as appropriate through internal wiring (not shown) formed in the inner package 3 to electrically couple the resonator element 6, the heat generation IC 7, the oscillation IC 8, and the external terminal 344. The inside and the outside of such an inner package 3 are electrically coupled via the external terminal 344.

The inner package 3 as described above is fixed to the bottom surface of the third upper recess 211c via a bonding member B3 having sufficiently low thermal conductivity at the inner lid 32.

As shown in FIG. 3, the heat generation IC 7 is disposed at the bottom surface of the third recess 311c with an active surface facing downward (toward the inner lid 32) and is electrically coupled to the plurality of internal terminals 342 via the bonding wire BW4. The oscillation IC 8 is disposed at the bottom surface of the third recess 311c with an active surface facing downward (toward the inner lid 32) and is electrically coupled to the plurality of internal terminals 343 via the bonding wire BW5.

As shown in FIG. 4, the resonator 5 includes a package 51 and a resonator element 55 housed in the package 51.

The package 51 includes a base 52 and a lid 53. The base 52 has a recess 521 that opens in a lower surface 52b. The resonator element 55 is disposed at a bottom surface of the recess 521.

The lid 53 is bonded to the lower surface 52b of the base 52 via a sealing member 54 such as a seal ring or low-melting-point glass to close the opening of the recess 521. Accordingly, the recess 521 is hermetically sealed, and a housing space S5 is formed in the package 51. The resonator element 55 is housed in the housing space S5. The housing space S5 is airtight and in a reduced pressure state, and is preferably in a state closer to vacuum. Accordingly, viscous resistance in the housing space S5 is reduced, and a vibrational characteristic of the resonator element 55 is improved. However, the atmosphere in the housing space S5 is not particularly limited.

The base 52 includes a plurality of internal terminals 561 disposed at the bottom surface of the recess 521 and a plurality of external terminals 564 disposed at an upper surface 52a of the base 52. Each internal terminal 561 is electrically coupled to the resonator element 55 via a conductive bonding member B4. The terminals 561 and 564 are electrically coupled as appropriate through internal wiring (not shown) formed in the base 52 to electrically couple the resonator element 55 and the external terminal 564. The inside and the outside of the package 51 are electrically coupled via the external terminal 564.

The resonator element 55 is an AT cut quartz crystal resonator element. Alternatively, the resonator element 55 may not be the AT cut quartz crystal resonator element, but may be, for example, an SC cut quartz crystal resonator element, a BT cut quartz crystal resonator element, a tuning fork type quartz crystal resonator element, a surface acoustic wave resonator, another piezoelectric resonator element, or a MEMS resonator element.

As shown in FIG. 4, the resonator 5 is fixed to the bottom surface of the lower recess 212 via the conductive bonding member B1. The external terminal 564 and the internal terminal 243 are electrically coupled via the bonding member B1.

1-2. Functional Configuration of Oscillator

Figure 5:
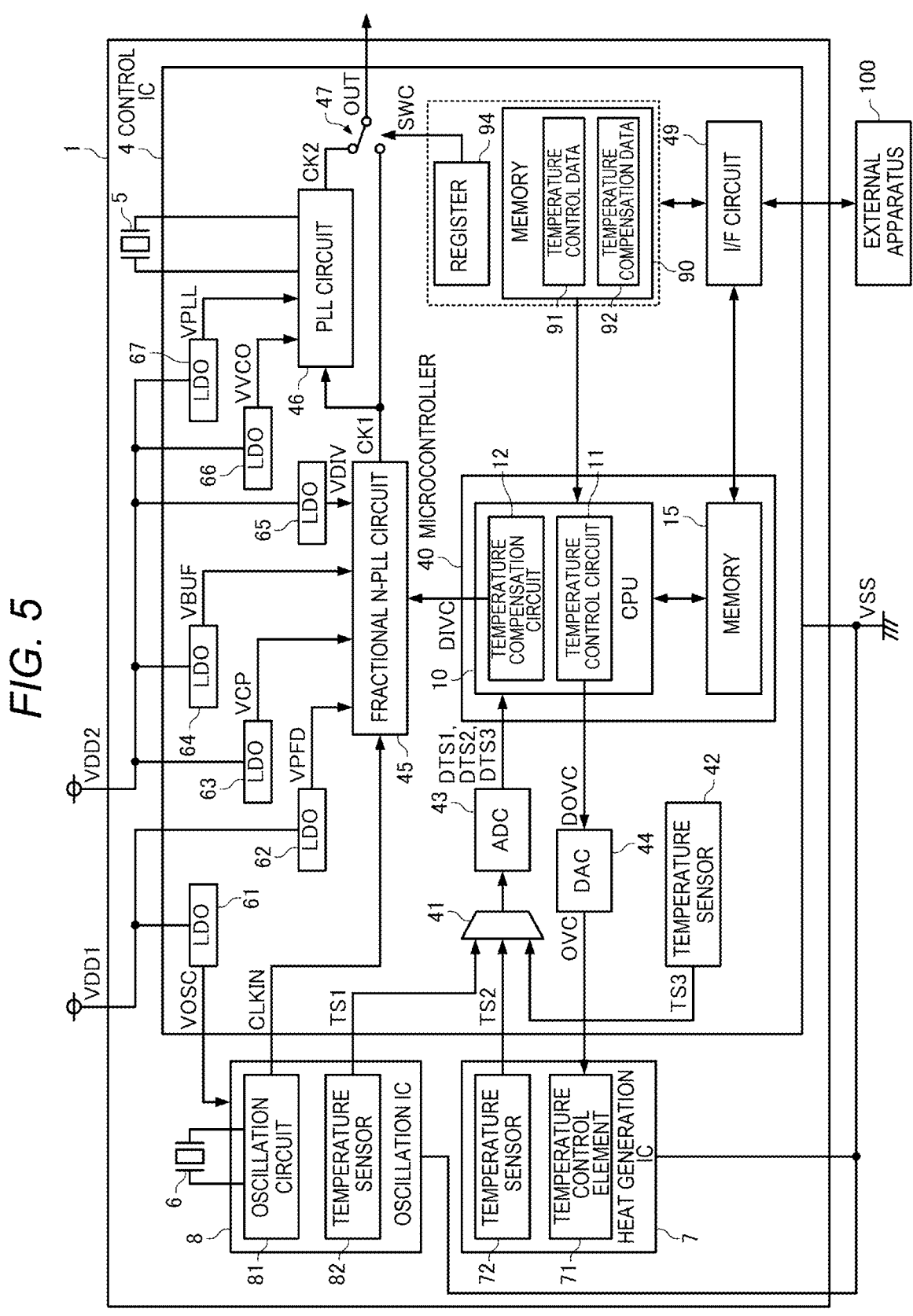
FIG. 5 is a functional block diagram of an oscillator of a first embodiment.

FIG. 5 is a functional block diagram of the oscillator 1 of a first embodiment. In FIG. 5, the same component elements as those in FIGS. 1 to 4 have the same signs. As shown in FIG. 5, the oscillator 1 of the first embodiment includes the control IC 4, the resonator 5, the resonator element 6, the heat generation IC 7, and the oscillation IC 8.

The oscillation IC 8 includes an oscillation circuit 81 and a temperature sensor 82, and is supplied with a power supply voltage VOSC from the control IC 4 and operates. The oscillation circuit 81 is a circuit that is electrically coupled to both ends of the resonator element 6, amplifies the output signal of the resonator element 6, and feeds back the amplified signal to the resonator element 6, and thereby, oscillates the resonator element 6 and outputs a reference clock signal CLKIN as a clock signal based on the oscillation signal. In other words, the oscillation circuit 81 is a circuit that operates at a frequency fCLKIN of the reference clock signal CLKIN. For example, the oscillation circuit 81 may be an oscillation circuit using an inverter as an amplification element or may be an oscillation circuit using a bipolar transistor as the amplification element. The reference clock signal CLKIN output from the oscillation circuit 81 is input to the control IC 4.

The temperature sensor 82 is a thermosensitive device that detects a temperature and outputs a temperature detection signal TS1 having a voltage level corresponding to the detected temperature. The temperature sensor 82 is provided in the oscillation IC 8 to detect the temperature of the oscillation IC 8. The temperature detection signal TS1 output from the temperature sensor 82 is input to the control IC 4. The temperature sensor 82 may be, for example, a sensor utilizing temperature dependence of a forward voltage of a PN junction of a diode.

The heat generation IC 7 includes a temperature control element 71 and a temperature sensor 72. The temperature control element 71 is an element that controls a temperature of the resonator element 6 based on a temperature control signal OVC output from the control IC 4, and may be a heat generation element. For example, the temperature control element 71 is a CMOS transistor, and an amount of generated heat changes according to a voltage of the temperature control signal OVC input to a gate. The larger the amount of heat generated by the temperature control element 71, the higher the temperature of the resonator element 6. The amount of heat generated by the temperature control element 71 is controlled by the control IC 4 so that the temperature of the resonator element 6 is constant at a target set temperature. For example, the set temperature may be a fixed value such as 80° C., or may be optionally set within a predetermined range such as a range from 70° C. to 125° C.

The temperature sensor 72 is a thermosensitive device that detects a temperature and outputs a temperature detection signal TS2 having a voltage level corresponding to the detected temperature. The temperature sensor 72 is provided in the heat generation IC 7 to detect the temperature of the heat generation IC 7. Since the temperature control element 71 is also provided in the heat generation IC 7, the temperature sensor 72 detects the temperature of the temperature control element 71. The temperature detection signal TS2 output from the temperature sensor 72 is input to the control IC 4. The temperature sensor 72 may be, for example, a sensor utilizing temperature dependence of a forward voltage of a PN junction of a diode.

As shown in FIG. 3, the resonator element 6, the heat generation IC 7, and the oscillation IC 8 are housed in the inner package 3, and heat generation of the heat generation IC 7 is controlled by the control IC 4 so that the temperature of the resonator element 6 is kept constant. The heat generation IC 7 is a heat source, radiant heat from the heat generation IC 7 is transmitted to the resonator element 6 and the oscillation IC 8, and thus a difference occurs between the temperatures of the resonator element 6 and the oscillation IC 8 and the temperature of the heat generation IC 7. Meanwhile, the resonator element 6 and the oscillation IC 8 are disposed apart from the heat generation IC 7, and assuming that the thermal distance between the heat generation IC 7 and the resonator element 6 is substantially the same as the thermal distance between the heat generation IC 7 and the oscillation IC 8, the temperature of the oscillation IC 8 may be regarded as being close to the temperature of the resonator element 6. That is, the temperature detected by the temperature sensor 82 provided in the oscillation IC 8 is closer to the temperature of the resonator element 6 than the temperature detected by the temperature sensor 72 provided in the heat generation IC 7. Therefore, as will be described later, the control IC 4 controls heat generation of the heat generation IC 7 based on the temperature detection signal TS1 output from the temperature sensor 82. However, depending on the arrangement of the resonator element 6, the heat generation IC 7, and the oscillation IC 8, the temperature of the heat generation IC 7 may be closer to the temperature of the resonator element 6 than the temperature of the oscillation IC 8, and in this case, the control IC 4 may control the heat generation of the heat generation IC 7 based on the temperature detection signal TS2 output from the temperature sensor 72.

The control IC 4 is externally supplied with a first power supply voltage VDD1, a second power supply voltage VDD2, and a ground voltage VSS and operates. The control IC 4 includes a microcontroller 40, a selector 41, a temperature sensor 42, an A/D converter circuit 43, a D/A converter circuit 44, a fractional N-PLL circuit 45, a PLL circuit 46, a switch circuit 47, an interface circuit 49, LDO regulators 61 to 67, a memory 90, and a register 94. The PLL is an abbreviation for Phase Locked Loop. The LDO is an abbreviation for Low Drop Out.

The LDO regulator 61 is a power supply circuit that generates a power supply voltage VOSC as a fixed voltage lower than the first power supply voltage VDD1 based on the first power supply voltage VDD1 supplied from the outside of the oscillator 1. The power supply voltage VOSC is supplied to the oscillation circuit 81 of the oscillation IC 8.

The LDO regulator 62 is a power supply circuit that generates a power supply voltage VPFD as a fixed voltage lower than the first power supply voltage VDD1 based on the first power supply voltage VDD1. The power supply voltage VPFD is supplied to the fractional N-PLL circuit 45.

The LDO regulator 63 is a power supply circuit that generates a power supply voltage VCP as a fixed voltage lower than the second power supply voltage VDD2 based on the second power supply voltage VDD2 supplied from the outside of the oscillator 1. The power supply voltage VCP is supplied to the fractional N-PLL circuit 45.

The LDO regulator 64 is a power supply circuit that generates a power supply voltage VBUF as a fixed voltage lower than the second power supply voltage VDD2 based on the second power supply voltage VDD2. The power supply voltage VBUF is supplied to the fractional N-PLL circuit 45.

The LDO regulator 65 is a power supply circuit that generates a power supply voltage VDIV as a fixed voltage lower than the second power supply voltage VDD2 based on the second power supply voltage VDD2. The power supply voltage VDIV is supplied to the fractional N-PLL circuit 45.

The LDO regulator 66 is a power supply circuit that generates a power supply voltage VVCO as a fixed voltage lower than the second power supply voltage VDD2 based on the second power supply voltage VDD2. The power supply voltage VVCO is supplied to the PLL circuit 46.

The LDO regulator 67 is a power supply circuit that generates a power supply voltage VPLL as a fixed voltage lower than the second power supply voltage VDD2 based on the second power supply voltage VDD2. The power supply voltage VPLL is supplied to the PLL circuit 46.

The frequency $f_{CLKIN}$ of the reference clock signal CLKIN output from the oscillation IC 8 is input, and the fractional N-PLL circuit 45 generates and outputs a clock signal CK1 obtained by conversion of the frequency $f_{CLKIN}$ Of the reference clock signal CLKIN into a frequency $f_{CK1}$ according to a division ratio commanded by a division ratio control signal DIVC.

Figure 6:
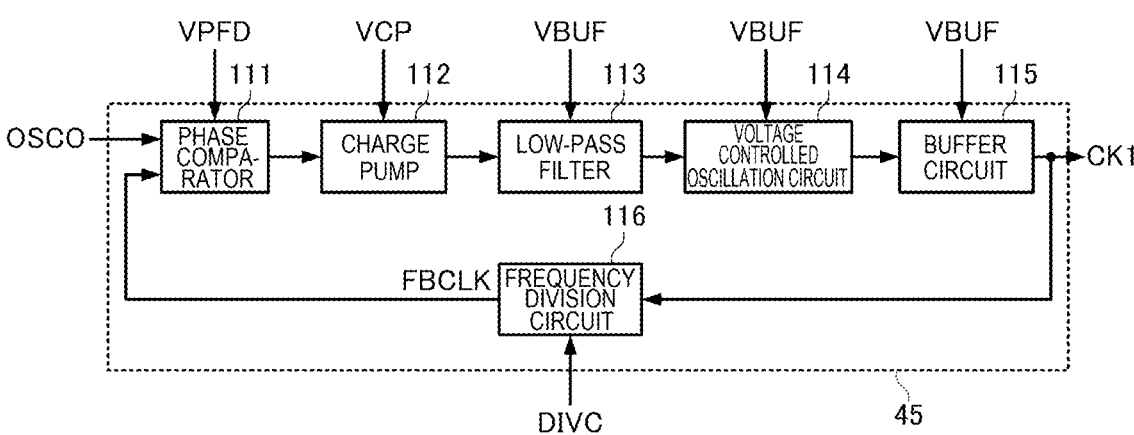
FIG. 6 shows a configuration example of a fractional N-PLL circuit.

FIG. 6 shows a configuration example of the fractional N-PLL circuit 45. As shown in FIG. 6, the fractional N-PLL circuit 45 includes a phase comparator 111, a charge pump 112, a low-pass filter 113, a voltage controlled oscillation circuit 114, a buffer circuit 115, and a frequency division circuit 116.

The phase comparator 111 is supplied with the power supply voltage VPFD and operates, and the charge pump 112 is supplied with the power supply voltage VCP and operates. The low-pass filter 113, the voltage controlled oscillation circuit 114, and the buffer circuit 115 are supplied with the power supply voltage VBUF and operate. The frequency division circuit 116 is supplied with the power supply voltage VDIV and operates.

The phase comparator 111 compares the phase of the reference clock signal CLKIN with the phase of a clock signal FBCLK output by the frequency division circuit 116, and outputs a comparison result as a pulse voltage.

The charge pump 112 converts the pulse voltage output by the phase comparator 111 into a current, and the low-pass filter 113 smooths and converts the current output by the charge pump 112 into a voltage.

The voltage controlled oscillation circuit 114 outputs an oscillation signal having a frequency that changes according to the output voltage of the low-pass filter 113. The voltage controlled oscillation circuit 114 can be implemented as various types of oscillation circuits including an LC oscillation circuit formed using an inductance element such as a coil and a capacitance element such as a capacitor and an oscillation circuit using a piezoelectric resonator such as a quartz crystal resonator.

The buffer circuit 115 buffers the oscillation signal output from the voltage controlled oscillation circuit 114 and outputs the clock signal CK1.

The frequency division circuit 116 outputs the clock signal FBCLK obtained by division of the clock signal CK1 output by the buffer circuit 115 using a value of the division ratio control signal DIVC as the division ratio.

The fractional N-PLL circuit 45 having the above-described configuration generates the clock signal CK1 by feedback control such that the phase of the reference clock signal CLKIN coincides with the phase of a signal obtained by division of the clock signal CK1 using the division ratio designated by the division ratio control signal DIVC. The division ratio control signal DIVC is delta-sigma modulated, and the division ratio designated by the division ratio control signal DIVC is changed among a plurality of integer division ratios and averaged to be a fractional division ratio. The frequency $f_{CK1}$ is a non-integral multiple of the frequency $f_{CLKIN}$. The fractional N-PLL circuit 45 may output the clock signal CK1 having the frequency $f_{CK1}$ that is different from the frequency $f_{CLKIN}$ and is substantially constant regardless of an outside air temperature according to the division ratio control signal DIVC.

Returning to description of FIG. 5, the clock signal CK1 output from the fractional N-PLL circuit 45 is input, and the PLL circuit 46 generates and outputs a clock signal CK2 having a frequency $f_{CK2}$ that is the same frequency as the frequency $f_{CK1}$ of the clock signal CK1.

Figure 7:
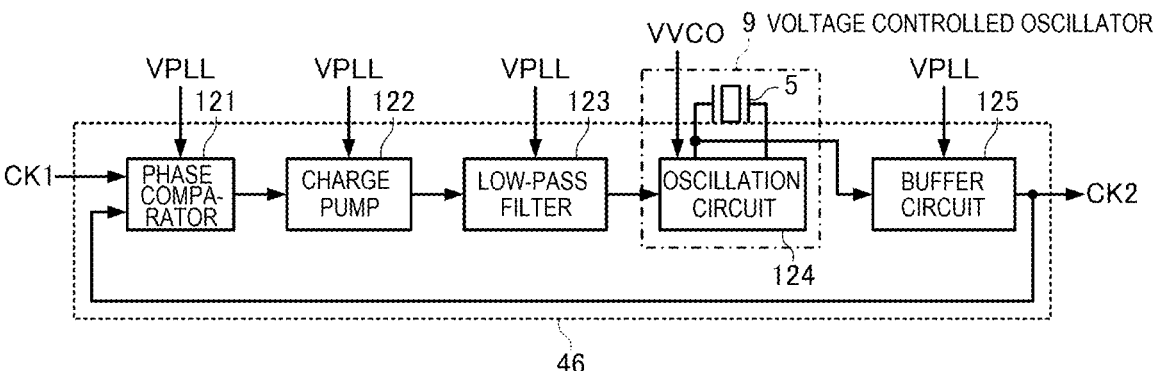
FIG. 7 shows a configuration example of a PLL circuit.

FIG. 7 shows a configuration example of the PLL circuit 46. As shown in FIG. 7, the PLL circuit 46 includes a phase comparator 121, a charge pump 122, a low-pass filter 123, an oscillation circuit 124, and a buffer circuit 125.

The phase comparator 121, the charge pump 122, the low-pass filter 123, and the buffer circuit 125 are supplied with the power supply voltage VPLL and operate. The oscillation circuit 124 is supplied with the power supply voltage VVCO and operates.

The phase comparator 121 compares the phase of the clock signal CK1 with phase of the clock signal CK2 output by the buffer circuit 125, and outputs a comparison result as a pulse voltage.

The charge pump 122 converts the pulse voltage output by the phase comparator 121 into a current, and the low-pass filter 123 smooths and converts the current output by the charge pump 122 into a voltage.

The oscillation circuit 124 generates an oscillation signal VO_XI having a frequency $f_{CK2}$ that changes according to the output voltage of the low-pass filter 123. Specifically, the oscillation circuit 124 is coupled to the resonator 5, oscillates the resonator 5, and generates the oscillation signal VO_XI having the frequency corresponding to the output voltage of the low-pass filter 123. That is, the oscillation circuit 124 outputs an oscillation signal VO_XO obtained by amplifying the oscillation signal VO_XI output from the resonator 5 to the resonator 5, and thereby, the resonator 5 continues to oscillate.

The buffer circuit 125 buffers the oscillation signal VO_XI generated by the oscillation circuit 124 and outputs the clock signal CK2 having the frequency fck2. As will be described later, in the normal operation of the oscillator 1, the clock signal CK2 is selected as an output clock signal OUT, and the buffer circuit 125 outputs the output clock signal OUT.

Thus, the resonator 5 and the oscillation circuit 124 form a voltage controlled oscillator 9 having an oscillation frequency that changes according to the output voltage of the low-pass filter 123.

The clock signal CK1 output from the fractional N-PLL circuit 45 is input and the PLL circuit 46 having the above-described configuration synchronizes the phase of the clock signal CK2 with that of the clock signal CK1. That is, the PLL circuit 46 generates and outputs the clock signal CK2 having the frequency $f_{CK2}$ that is the same frequency as the frequency $f_{CK1}$ of the clock signal CK1 by feedback control of the output voltage of the low-pass filter 123 such that the phase of the clock signal CK1 coincides with the phase of the clock signal CK2.

Returning to the description of FIG. 5, the clock signal CK1 output from the fractional N-PLL circuit 45 has the frequency $f_{CK1}$ that is a non-integral multiple of the frequency $f_{CLKIN}$ of the reference clock signal CLKIN, and has larger jitter. In contrast, the clock signal CK2 output from the PLL circuit 46 has the frequency $f_{CK2}$ that is the same as the frequency $f_{CK1}$ of the clock signal CK1 and is generated by oscillation of the resonator 5 having higher frequency stability, and has jitter smaller than that of the clock signal CK1.

The switch circuit 47 outputs the output clock signal OUT obtained by selecting the clock signal CK1 or the clock signal CK2 according to a logic level of a switch control signal SWC output from the register 94. The output clock signal OUT is output to the outside of the oscillator 1. The output clock signal OUT may be supplied to an external apparatus 100 or may be supplied to an apparatus different from the external apparatus 100. For example, the clock signal CK2 with the smaller jitter may be selected as the output clock signal OUT in the normal operation of the oscillator 1, and the clock signal CK1 may be selected as the output clock signal OUT in the inspection of the clock signal CK1.

The temperature sensor 42 is a thermosensitive device that detects a temperature and outputs a temperature detection signal TS3 having a voltage level corresponding to the detected temperature. The temperature sensor 42 is provided in the control IC 4 to detect the temperature of the control IC 4. As shown in FIG. 1, the control IC 4 is disposed close to the outer lid 22, the distance between the resonator element 6 and the temperature sensor 42 is larger than the distance between the resonator element 6 and the temperature sensor 82 provided in the oscillation IC 8, and the temperature of the control IC 4 is easily affected by the outside air temperature of the oscillator 1. Therefore, when the amount of heat generated by the control IC 4 is substantially constant, the temperature sensor 42 can detect changes of the outside air temperature of the oscillator 1. The temperature detection signal TS2 output from the temperature sensor 72 is input to the control IC 4. The temperature sensor 72 may be, for example, a sensor utilizing temperature dependence of a forward voltage of a PN junction of a diode.

The selector 41 selects and outputs one of the temperature detection signal TS1 output from the oscillation IC 8, the temperature detection signal TS2 output from the heat generation IC 7, and the temperature detection signal TS3 output from the temperature sensor 42. In the embodiment, the selector 41 selects the temperature detection signals TS1, TS2, and TS3 in a time-division manner and periodically outputs the selected signals.

The A/D converter circuit 43 converts the respective voltages of the temperature detection signals TS1, TS2, and TS3 as analog signals output from the selector 41 in the time-division manner into temperature codes DTS1, DTS2, and DTS3 as digital signals, respectively. The A/D converter circuit 43 may convert the temperature detection signals TS1, TS2, and TS3 into the temperature codes DTS1, DTS2, and DTS3 after converting voltage levels by resistance voltage division or the like.

The microcontroller 40 includes a CPU 10 and a memory 15. The CPU is an abbreviation for Central Processing Unit. Temperature control data 91 and temperature compensation data 92 are stored in the nonvolatile memory 90 and are transferred to the memory 15 when the oscillator 1 is started up. Further, a temperature control program and a temperature compensation program (not shown) are stored in the nonvolatile memory 90 and are transferred to the memory 15 when the oscillator 1 is started up.

The CPU 10 functions as a temperature control circuit 11 by executing the temperature control program transferred to the memory 15. The temperature control circuit 11 controls the operation of the temperature control element 71 provided in the heat generation IC 7. Specifically, the temperature control circuit 11 outputs a temperature control code DOVC for controlling the amount of heat generated by the temperature control element 71 based on the temperature code DTS1 and the temperature control data 91 transferred to and stored in the memory 15. For example, the temperature control data 91 may include information on the target set temperature for the temperature of the resonator element 6 and gain information for controlling the amount of heat generated by the temperature control element 71. Alternatively, when the target set temperature for the temperature of the resonator element 6 varies depending on the outside air temperature, the temperature control data 91 may include information indicating a relationship between the temperature code DTS3 and the set temperature. In this case, the temperature control circuit 11 outputs the temperature control code DOVC based on the temperature codes DTS1 and DTS3, and the temperature control data 91.

The CPU 10 functions as a temperature compensation circuit 12 by executing the temperature compensation program transferred to the memory 15. The temperature compensation circuit 12 performs temperature compensation on the frequency of the reference clock signal CLKIN generated by the oscillation circuit 81 provided in the oscillation IC 8 oscillating the resonator element 6. Specifically, the temperature compensation circuit 12 outputs the division ratio control signal DIVC for causing the fractional N-PLL circuit 45 to output the clock signal CK1 having a constant frequency regardless of the temperature based on the temperature code DTS3 and the temperature compensation data 92 transferred to the memory 15. For example, the temperature compensation data 92 may be table information indicating a relationship between the temperature code DTS3 and the frequency of the reference clock signal CLKIN or may be information on a coefficient value for each order in a mathematical formula indicating the relationship. Alternatively, the temperature compensation data 92 may be information indicating a relationship between the temperature code DTS3 and a value of a fractional division ratio of the fractional N-PLL circuit 45 calculated from the relationship between the temperature code DTS3 and the frequency of the reference clock signal CLKIN.

The D/A converter circuit 44 converts the temperature control code DOVC as a digital signal output from the temperature control circuit 11 into the temperature control signal OVC as an analog signal. The temperature control signal OVC is supplied to the temperature control element 71 of the heat generation IC 7.

The interface circuit 49 is a circuit for data communication with the external apparatus 100 coupled to the oscillator 1. Specifically, the interface circuit 49 writes or reads data to or from the memory 90, the register 94, or the memory 15 of the microcontroller 40 in response to a request from the external apparatus 100. The interface circuit 49 may be, for example, an interface circuit corresponding to an I²C bus or an interface circuit corresponding to an SPI bus. The I²C is an abbreviation for Inter-Integrated Circuit. The SPI is an abbreviation for Serial Peripheral Interface.

In an inspection process at the time of manufacturing of the oscillator 1, an inspection apparatus as the external apparatus 100 may set the switch control signal SWC for causing the switch circuit 47 to select the clock signal CK1 via the interface circuit 49 and inspect the clock signal CK1. The inspection apparatus as the external apparatus 100 writes the temperature control data 91 and the temperature compensation data 92, and further writes the temperature control program and the temperature compensation program in the memory 90 via the interface circuit 49. Note that the external apparatus 100 may set the temperature control data 91 and the temperature compensation data 92 in the register 94 when the oscillator 1 is started up.

1-3. Layout Configuration of Control IC

As described above, the frequency $f_{CK1}$ of the clock signal CK1 is a non-integral multiple of the frequency $f_{CLKIN}$ of the reference clock signal CLKIN, and the frequency $f_{CK2}$ of the clock signal CK2 is the same as the frequency $f_{CK1}$ the clock signal CK1. In the normal operation, the clock signal CK2 is selected as the output clock signal OUT, and the frequency $f_{CLKIN}$ of the reference clock signal CLKIN input to the control IC 4 and the frequency $f_{CK2}$ of the output clock signal OUT output from the control IC 4 are different from each other. Accordingly, the signal at the frequency $f_{CLKIN}$ and the signal at the frequency $f_{CK2}$ may interfere with each other and beat noise having a frequency of the difference between the frequency $f_{CLKIN}$ and the frequency $f_{CK2}$ may be generated as spurious noise. Therefore, in the embodiment, in order to reduce the spurious noise, the layout configuration of the control IC 4 is devised.

FIG. 8 shows a layout configuration of the control IC 4 in the first embodiment. In FIG. 8, only the arrangement of some of pads and the like necessary for the description is illustrated. As shown in FIG. 8, the control IC 4 includes a semiconductor substrate 400. In a plan view, the semiconductor substrate 400 has a first side 401, a second side 402 as an opposite side to the first side 401, a third side 403 intersecting the first side 401 and the second side 402, and a fourth side 404 as an opposite side to the third side 403. Note that the contours of the control IC 4 and the semiconductor substrate 400 substantially coincide with each other in the plan view. Accordingly, the control IC 4 has the first side 401, the second side 402, the third side 403, and the fourth side 404 in the plan view.

On the semiconductor substrate 400, pads P1, P2, P3, P4 and P5 are arranged along the first side 401. The pad P1 is a clock input terminal to which the reference clock signal CLKIN is input. The pad P2 is a ground terminal to which the ground voltage VSS is supplied. The pad P3 is a power supply voltage input terminal to which the first power supply voltage VDD1 as the source of the power supply voltage VOSC supplied to the oscillation circuit 81 is input. The pad P4 is a ground terminal to which the ground voltage VSS is supplied. The pad P5 is a power supply voltage output terminal that outputs the power supply voltage VOSC. The pad P1, the pad P2, the pad P3, the pad P4, and the pad P5 are arranged in this order along the first side 401.

Further, on the semiconductor substrate 400, pads P6, P7, P8, P9, P10, and P11 are arranged along the second side 402. The pad P6 is a power supply voltage input terminal to which the second power supply voltage VDD2 as the source of the power supply voltages VVCO and VPLL supplied to the PLL circuit 46 is input. The pad P7 is a ground terminal to which the ground voltage VSS is supplied. The pad P8 is a clock output terminal from which the output clock signal OUT having the frequency different from that of the reference clock signal CLKIN is output. The pad P9 is a ground terminal to which the ground voltage VSS is supplied. The pad P10 is a first resonator terminal coupled to the resonator 5, the oscillation circuit 124, and the buffer circuit 125. The pad P11 is a second resonator terminal coupled to the resonator 5 and the oscillation circuit 124. That is, the oscillation signal VO_XI output from the resonator 5 is input to the oscillation circuit 124 and the buffer circuit 125 via the pad P10 as the first resonator terminal, and the oscillation signal VO_XO amplified by the oscillation circuit 124 is input to the resonator 5 via the pad P11 as the second resonator terminal. The pad P6, the pad P7, the pad P8, the pad P9, the pad P10, and the pad P11 are arranged in this order along the second side 402.

As described above, the pad P1 to which the reference clock signal CLKIN having the frequency $f_{CLKIN}$ is input and the pad P8 to which the output clock signal OUT having the frequency $f_{CK2}$ is output are provided in positions apart from each other. Further, the fractional N-PLL circuit 45 to which the reference clock signal CLKIN having the frequency $f_{CLKIN}$ is input is provided in a position closer to the first side 401 than the second side 402. Furthermore, the PLL circuit 46 that outputs the clock signal CK2 having the frequency $f_{CK2}$ is provided in a position closer to the second side 402 than the first side 401. The first power supply voltage VDD1 as the source of the power supply voltage VOSC supplied to the oscillation circuit 81 operating at the frequency $f_{CLKIN}$ and the second power supply voltage VDD2 as the source of the power supply voltages VVCO and VPLL supplied to the PLL circuit 46 operating at the frequency $f_{CK2}$ are input from the two different pads P2 and P5, respectively, and the pad P2 and the pad P5 are provided in positions apart from each other. That is, since the arrangement region of the circuit that operates at the frequency $f_{CLKIN}$ based on the first power supply voltage VDD1 and the arrangement region of the circuit that operates at the frequency $f_{CK2}$ based on the second power supply voltage VDD2 are separated as much as possible, spurious noise generated due to the interference between the signal having the frequency $f_{CLKIN}$ and the signal having frequency $f_{CK2}$ is reduced.

Further, the pad P2 as the ground terminal is disposed between the pad P1 as the clock input terminal and the pad P3 as the power supply voltage input terminal along the first side 401. That is, since the pad P2 as the ground terminal is disposed next to the pad P1 as the clock input terminal, as shown in FIG. 9, the magnetic field generated by a current I1 based on the charging and discharging when the reference clock signal CLKIN is input to the pad P1 is weakened by the magnetic field generated by a current I2 flowing to the ground via the pad P2. Therefore, the electromagnetic field coupling between the node to which the reference clock signal CLKIN is input and the node of the first power supply voltage VDD1 becomes smaller, and an induced current I3 flowing to the node of the first power supply voltage VDD1 is reduced by electromagnetic induction based on the magnetic field, and thereby, fluctuations of the first power supply voltage VDD1 are reduced. Further, the capacitive coupling between the pad P1 and the pad P3 is reduced by the pad P2 as the ground terminal, and thereby, noise of the frequency $f_{CLKIN}$ based on the reference clock signal CLKIN is less likely to be superimposed on the first power supply voltage VDD1.

The pads P2 and P4 as the ground terminals are disposed between the pad P5 as the power supply voltage output terminal and the pad P1 as the clock input terminal along the first side 401. Accordingly, the magnetic field generated by the current based on charging and discharging when the reference clock signal CLKIN is input to the pad P1 is weakened by the magnetic field generated by currents flowing to the ground via the pads P2 and P4. Therefore, the electromagnetic field coupling between the node to which the reference clock signal CLKIN is input and the node of the power supply voltage VOSC becomes smaller, and an induced current flowing to the node of the power supply voltage VOSC is reduced by electromagnetic induction based on the magnetic field, and thereby, fluctuations of the power supply voltage VOSC are reduced.

The pad P4 as the ground terminal is disposed between the pad P5 as the power supply voltage output terminal and the pad P3 as the power supply voltage input terminal along the first side 401. Accordingly, the magnetic field generated by the current based on the fluctuations of the power supply voltage VOSC and the magnetic field generated by the current based on the fluctuations of the first power supply voltage VDD1 are weakened by the magnetic field generated by the current flowing to the ground. Therefore, the electromagnetic field coupling between the node of the first power supply voltage VDD1 and the node of the power supply voltage VOSC becomes smaller, and an induced current flowing to the node of the first power supply voltage VDD1 and the node of the power supply voltage VOSC is reduced by the electromagnetic induction based on the magnetic field, and thereby, fluctuations of the power supply voltage VOSC and fluctuations of the first power supply voltage VDD1 are reduced.

Since the pads P2 and P4 as the ground terminals are disposed on both sides of the pad P3 as the power supply voltage input terminal along the first side 401, the magnetic field generated by the current based on the fluctuations of the first power supply voltage VDD1 is weakened by the magnetic field generated by the current flowing to the ground. Therefore, the electromagnetic field coupling between the node of the first power supply voltage VDD1 and each node inside the control IC 4 is reduced, and fluctuations of each node are reduced.

Further, the pad P7 as the ground terminal is disposed between the pad P8 as the clock output terminal and the pad P6 as the second power supply voltage input terminal along the second side 402. That is, since the pad P7 as the ground terminal is disposed next to the pad P8 as the clock output terminal, the magnetic field generated by the current based on charging and discharging when the output clock signal OUT is output from the pad P8 is weakened by the magnetic field generated by the current flowing to the ground via the pad P7. Therefore, the electromagnetic field coupling between the node from which the output clock signal OUT is output and the node of the second power supply voltage VDD2 becomes smaller, and an induced current flowing to the node of the second power supply voltage VDD2 is reduced by the electromagnetic induction based on the magnetic field, and the noise of the frequency $f_{CK2}$ superimposed on the second power supply voltage VDD2 is reduced. Further, the capacitive coupling between the pad P6 and the pad P8 is reduced by the pad P7 as the ground terminal, and thereby, noise of the frequency fcx2 based on the output clock signal OUT is less likely to be superimposed on the second power supply voltage VDD2.

The pad P9 as the ground terminal is disposed between the pad P10 as the first resonator terminal and the pad P8 as the clock output terminal along the second side 402. Accordingly, the magnetic field generated by the current based on charging and discharging when the output clock signal OUT is output from the pad P8 is weakened by the magnetic field generated by the current flowing to the ground via the pad P9. Therefore, the electromagnetic field coupling between the node to which the output clock signal OUT is output and the node to which the oscillation signal VO_XI is input becomes smaller, and an induced current flowing to the node to which the VO_XI is input is reduced by the electromagnetic induction based on the magnetic field, and thereby, fluctuations of the oscillation signal VO_XI are reduced.

The pads P7 and P9 as the ground terminals are disposed between the pad P10 as the first resonator terminal and the pad P6 as the power supply voltage input terminal along the second side 402. Accordingly, the magnetic field generated by the current based on the fluctuations of the oscillation signal VO_XI and the magnetic field generated by the current based on the fluctuations of the second power supply voltage VDD2 are weakened by the magnetic field generated by the current flowing to the ground. Therefore, the electromagnetic field coupling between the node of the second power supply voltage VDD2 and the node to which the oscillation signal VO_XI is input becomes smaller, and an induced current flowing to the node of the second power supply voltage VDD2 and the node to which the oscillation signal VO_XI is input is reduced by the electromagnetic induction based on the magnetic field, and thereby, fluctuations of the oscillation signal VO_XI are reduced and fluctuations of the second power supply voltage VDD2 are reduced.

Since the pad P7 as the ground terminal is disposed next to the pad P6 as the power supply voltage input terminal along the second side 402, the magnetic field generated by the current based on the fluctuations of the second power supply voltage VDD2 is weakened by the magnetic field generated by the current flowing to the ground. Therefore, the electromagnetic field coupling between the node of the second power supply voltage VDD2 and each node in the control IC 4 is reduced, and fluctuations of each node is reduced.

As shown in FIG. 8, the LDO regulator 61 that outputs the power supply voltage VOSC is provided in a position close to the pad P5. Accordingly, a wire 411 from the output of the LDO regulator 61 to the pad P5 is shorter, impedance thereof is reduced, and noise propagating from the node of the first power supply voltage VDD1 to the node of the power supply voltage VOSC is reduced by inverse PSNR characteristics of the LDO regulator 61.

The LDO regulator 62 that outputs the power supply voltage VPFD, the LDO regulator 63 that outputs the power supply voltage VCP, the LDO regulator 64 that outputs the power supply voltage VBUF, and the LDO regulator 65 that outputs the power supply voltage VDIV are provided in positions close to the fractional N-PLL circuit 45. Accordingly, each wire from each output of the LDO regulators 62, 63, 64, and 65 to the fractional N-PLL circuit 45 is shorter, impedance thereof is reduced, and noise propagating from the node of the first power supply voltage VDD1 to each node of the power supply voltage VPFD, the power supply voltage VCP, the power supply voltage VBUF, and the power supply voltage VDIV is reduced by inverse PSNR characteristics of the LDO regulators 62, 63, 64, and 65.

The LDO regulator 66 that outputs the power supply voltage VVCO and the LDO regulator 67 that outputs the power supply voltage VPLL are provided in positions close to the PLL circuit 46. Accordingly, each wire from each output of the LDO regulators 66 and 67 to the PLL circuit 46 is shorter, impedance thereof is reduced, and noise propagating from the node of the second power supply voltage VDD2 to each node of the power supply voltage VVCO, the power supply voltage VPLL is reduced by inverse PSNR characteristics of the LDO regulators 66 and 67.

As shown in FIG. 8, a first power supply wire 410 is provided on the semiconductor substrate 400. The first power supply wire 410 is coupled to the pad P3 and the LDO regulators 61 and 62, and the first power supply voltage VDD1 is supplied from the pad P3 to the LDO regulators 61 and 62 via the first power supply wire 410. Further, the first power supply wire 410 extends along a part of the outer edge of the arrangement region of the fractional N-PLL circuit 45.

A second power supply wire 420 is provided on the semiconductor substrate 400. The second power supply wire 420 is coupled to the pad P6 and the LDO regulators 63, 64, 65, 66, and 67, and the second power supply voltage VDD2 is supplied from the pad P6 to the LDO regulators 63, 64, 65, 66, and 67 via the second power supply wire 420. The second power supply wire 420 is provided along a part of the outer edge of the arrangement region of the PLL circuit 46 and a part of the outer edge of the arrangement region of the fractional N-PLL circuit 45.

As shown in FIG. 8, a part of the first power supply wire 410 and a part of the second power supply wire 420 are parallel to each other, and fluctuations of the first power supply voltage VDD1 and fluctuations of the second power supply voltage VDD2 are likely to interfere with each other by capacitive coupling between the first power supply wire 410 and the second power supply wire 420. Accordingly, a shield wire 430 is provided between the first power supply wire 410 and the second power supply wire 420. For example, since the first power supply wire 410, the second power supply wire 420, and the shield wire 430 are provided in the same wiring layer, capacitive coupling between the first power supply wire 410 and the second power supply wire 420 is effectively suppressed. Further, the first power supply wire 410 and the second power supply wire 420 are not annular and disposed so as not to come close to each other except a part with the shield wire 430 in between for reduction of the capacitive coupling between the first power supply wire 410 and the second power supply wire 420.

The pads P10 and P11 are pads coupled to the resonator 5, and each node coupled to each of the pads P10 and P11 is a high-impedance node, and noise is easily superimposed thereon. In particular, the pad P10 is a pad to which the oscillation signal VO_XI output from the resonator 5 is input, and the noise superimposed on the node of the pad P10 is amplified by the oscillation circuit 124. Therefore, the first power supply wire 410 and the second power supply wire 420 are provided farther from the pads P10 and P11. As a result, the shortest distance between the pad P10 and the second power supply wire 420 is longer than the shortest distance between the pad P8 as the clock output terminal and the second power supply wire 420.

The control IC 4 is an example of "integrated circuit device", and the oscillation IC 8 is an example of "second integrated circuit device". The oscillation circuit 81 is an example of "first circuit", and the PLL circuit 46 is an example of "second circuit". The pad P2 is an example of "first ground terminal", the pad P7 is an example of "second ground terminal", the pad P4 is an example of "third ground terminal", and the pad P9 is an example of "fourth ground terminal". The pad P3 is an example of "first power supply voltage input terminal", and the pad P6 is an example of "second power supply voltage input terminal".

1-4. Functions and Effects

As described above, in the oscillator 1 of the first embodiment, the control IC 4 has the layout configuration shown in FIG. 8, and thereby, the electromagnetic field coupling and capacitive coupling between the nodes are reduced and the spurious noise superimposed on the output clock signal OUT is reduced. According to the oscillator 1 of the first embodiment, the output clock signal OUT having a higher S/N ratio can be output. Further, since the plurality of wires outside the control IC 4 respectively coupled to the pads P1 to P11 are also arranged in the same manner as the pads P1 to P11, the above-described effects can also be obtained outside the control IC 4.

2. Second Embodiment

Regarding a second embodiment, the same configurations as those of the first embodiment have the same signs, and the same description as that of the first embodiment will be omitted or simplified and differences from the first embodiment will be mainly described as below.

A structure of an oscillator 1 of the second embodiment is the same as that in FIGS. 1 to 4, and the illustration and description thereof are omitted.

In the oscillator 1 of the first embodiment, in the control IC 4, the pad P4 as the ground terminal is disposed next to the pad P1 to which the reference clock signal CLKIN is input, and the pads P7 and P9 as the ground terminals are disposed on both sides of the pad P8 to which the output clock signal OUT is output. Accordingly, as shown in FIG. 10, when the impedance of the ground is higher, slight spurious noise may be superimposed on the output clock signal OUT due to capacitive coupling between the pad P1 and the ground and capacitive coupling between the ground and the pad P8.

Figure 11:
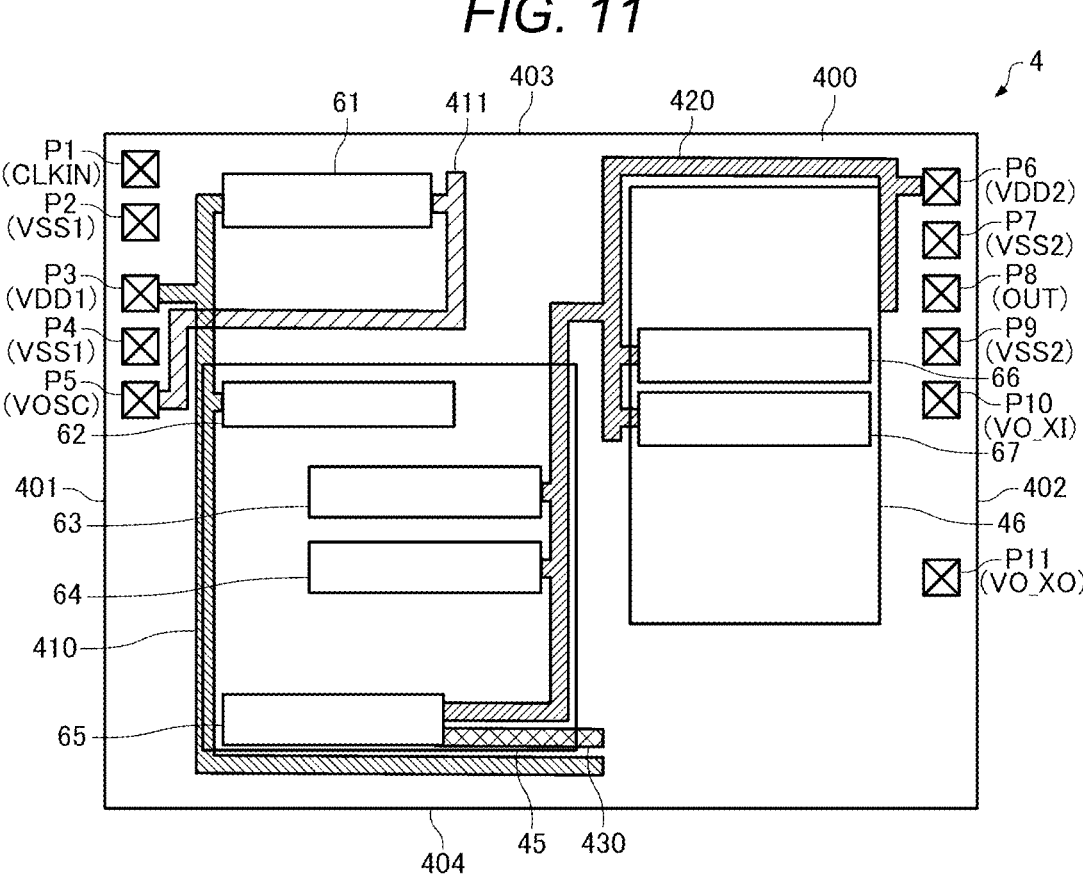
FIG. 11 shows a layout configuration of a control IC in a second embodiment.

In the oscillator 1 of the second embodiment, in the control IC 4, the pad P2 is coupled to a first ground outside the control IC 4 and the pads P7 and P9 are coupled to a second ground outside the control IC 4 different from the first ground. FIG. 11 shows a layout configuration of the control IC 4 in the second embodiment. In FIG. 11, the same component elements as those in FIG. 8 have the same signs.

Figure 12:
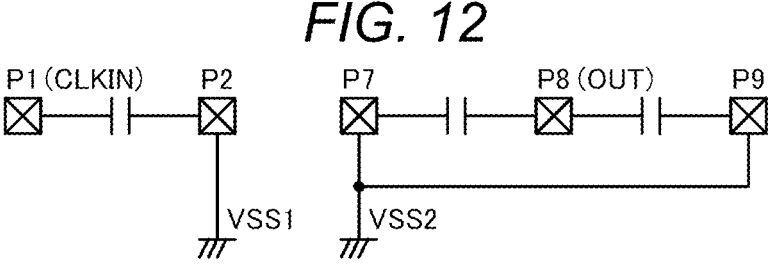
FIG. 12 shows capacitive coupling in the second embodiment.

The layout shown in FIG. 11 is different from the layout in FIG. 8 in that a first ground voltage VSS1 is supplied to the pads P2 and P4 and a second ground voltage VSS2 is supplied to the pads P7 and P9, and the rest of the layout is the same as the layout in FIG. 8. The pads P2 and P4 are coupled to the first ground, and the pads P7 and P9 are coupled to the second ground different from the first ground. The first ground voltage VSS1 is the voltage of the first ground, and the second ground voltage VSS2 is the voltage of the second ground. Accordingly, as shown in FIG. 12, capacitive coupling between the pad P1 and the first ground coupled to the adjacent pad P2 and capacitive coupling between the pad P8 and the second ground coupled to the pads P7 and P9 on both sides thereof are generated, however, the first ground and the second ground are separated and spurious noise is not superimposed on the output clock signal OUT by these capacitive couplings.

The functional block diagram of the oscillator 1 of the second embodiment is the same as that in FIG. 5 except that the first ground voltage VSS1 and the second ground voltage VSS2 are supplied, and the illustration and description thereof are omitted.

As described above, according to the oscillator 1 of the second embodiment, like the oscillator 1 of the first embodiment, the electromagnetic field coupling and capacitive coupling between the nodes are reduced, and the spurious noise superimposed on the output clock signal OUT is reduced. Further, since the first ground coupled to the pad P2 and the second ground coupled to the pads P7 and P9 are separated from each other, the interference between the reference clock signal CLKIN input to the pad P1 and the output clock signal OUT output from the pad P8 is reduced, and the spurious noise superimposed on the output clock signal OUT is further reduced. According to the oscillator 1 of the first embodiment, the output clock signal OUT having a higher S/N ratio can be output. Further, since the plurality of wires outside the control IC 4 respectively coupled to the pads P1 to P11 are also arranged in the same manner as the pads P1 to P11, the above-described effects can also be obtained outside the control IC 4.

3. Modifications

The present disclosure is not limited to the embodiments, and various modifications can be made within the scope of the gist of the present disclosure.

In the above-described respective embodiments, the temperature control element 71 and the temperature sensor 72 are provided in the heat generation IC 7, however, the temperature control element 71 and the temperature sensor 72 may be provided separately. In the above-described embodiments, the temperature sensor 82 is provided in the oscillation IC 8, however, the temperature sensor 82 and the oscillation IC 8 may be provided separately. In the above described embodiments, the temperature sensor 42 is provided in the control IC 4, however, the temperature sensor 42 and the control IC 4 may be provided separately. In these cases, for example, the temperature sensors 72, 82, and 42 may be thermistors or platinum resistors.

In the above-described respective embodiments, the control IC 4 includes the single temperature sensor 42, however, a plurality of temperature sensors may be provided. In this case, for example, the A/D converter circuit 43 may convert a plurality of temperature detection signals output from the plurality of temperature sensors into a plurality of temperature codes, and the microcontroller 40 may perform temperature control and temperature compensation based on the plurality of temperature codes. For example, the microcontroller 40 may perform temperature control and temperature compensation using an average value of the plurality of temperature codes as the temperature code DTS3.

In the above-described respective embodiments, the single A/D converter circuit 43 converts the voltages of the temperature detection signals TS1, TS2, and TS3 into the temperature codes DTS1, DTS2, and DTS3 in the time-division manner, respectively, however, for example, the control IC 4 may include a plurality of A/D converter circuits and the plurality of A/D converter circuits may respectively convert the voltages of the temperature detection signals TS1, TS2, and TS3 into the temperature codes DTS1, DTS2, and DTS3.

In the above-described respective embodiments, the temperature control element 71 is the heat generation element such as a CMOS transistor, however, the temperature control element 71 may be an element that can control the temperature of the resonator element 6 and may be a heat absorbing element such as a Peltier element depending on a relationship between the target set temperature of the temperature of the resonator element 6 and the outside air temperature.

The above-described embodiments and modifications are just examples, and the present disclosure is not limited thereto. For example, the respective embodiments and the respective modifications can be combined as appropriate.

The present disclosure includes substantially the same configurations as the configurations described in the embodiments, for example, configurations having the same functions, methods, and results or configurations having the same purposes and effects. The present disclosure includes a configuration in which a non-essential portion of the configuration described in the embodiment is replaced. Further, the present disclosure includes a configuration that exerts the same function and effect or a configuration that can achieve the same purpose as the configurations described in the embodiments. Furthermore, the present disclosure includes a configuration with the addition of a known technique to the configuration described in the embodiments.

The following configurations are derived from the above-described embodiments and the modifications.

An integrated circuit device according an aspect having a first side and a second side as an opposite side to the first side in a plan view, includes a clock input terminal disposed along the first side, to which a reference clock signal is input, a first power supply voltage input terminal disposed along the first side, to which a first power supply voltage as a source of a power supply voltage supplied to a first circuit that operates at a frequency of the reference clock signal is input, a clock output terminal disposed along the second side, from which an output clock signal having a frequency different from that of the reference clock signal is output, a second power supply voltage input terminal disposed along the second side, to which a second power supply voltage as a source of a power supply voltage supplied to a second circuit that operates at the frequency of the output clock signal is input, a first ground terminal disposed between the clock input terminal and the first power supply voltage input terminal along the first side, and a second ground terminal disposed between the clock output terminal and the second power supply voltage input terminal along the second side.

In the integrated circuit device, the magnetic field generated by the current based on charging and discharging when the reference clock signal is input to the clock input terminal is weakened by the magnetic field generated by the current flowing to the ground via the first ground terminal. Therefore, the electromagnetic field coupling between the node to which the reference clock signal is input and the node of the first power supply voltage becomes smaller, and an induced current flowing to the node of the first power supply voltage is reduced by the electromagnetic induction based on the magnetic field, and thereby, fluctuations of the first power supply voltage are reduced. Further, the capacitive coupling between the clock input terminal and the first power supply voltage input terminal is reduced by the first ground terminal, and thereby, noise based on the reference clock signal is less likely to be superimposed on the first power supply voltage.

In the integrated circuit device, the magnetic field generated by the current based on charging and discharging when the output clock signal is output from the clock output terminal is weakened by the magnetic field generated by the current flowing to the ground via the second ground terminal. Therefore, the electromagnetic field coupling between the node from which the output clock signal is output and the node of the second power supply voltage becomes smaller, and an induced current flowing to the node of the second power supply voltage is reduced by the electromagnetic induction based on the magnetic field, and the noise superimposed on the second power supply voltage is reduced. Further, the capacitive coupling between the clock output terminal and the second power supply voltage input terminal is reduced by the second ground terminal, and thereby, noise based on the output clock signal is less likely to be superimposed on the second power supply voltage.

As described above, according to the integrated circuit device, the electromagnetic field coupling and capacitive coupling between the nodes via the terminals are reduced and the spurious noise superimposed on the output clock signal is reduced, and an output clock signal having a higher S/N ratio can be output.

The integrated circuit device according to the aspect may include a power supply circuit generating the power supply voltage supplied to the first circuit based on the first power supply voltage, a power supply voltage output terminal disposed along the first side and outputting the power supply voltage supplied to the first circuit, and a third ground terminal disposed between the power supply voltage output terminal and the first power supply voltage input terminal or between the power supply voltage output terminal and the clock input terminal.

In the integrated circuit device, the magnetic field generated by the current based on charging and discharging when the reference clock signal is input to the clock input terminal is weakened by the magnetic field generated by the current flowing to the ground via the third ground terminal. Therefore, the electromagnetic field coupling between the node to which the reference clock signal is input and the node of the power supply voltage supplied to the first circuit becomes smaller, and an induced current flowing to the node of the power supply voltage is reduced by the electromagnetic induction based on the magnetic field and fluctuations of the power supply voltage are reduced. Further, the magnetic field generated by the current based on the fluctuations of the power supply voltage or the magnetic field generated by the current based on the fluctuations of the first power supply voltage are weakened by the magnetic field generated by the current flowing to the ground via the third ground terminal. Accordingly, the electromagnetic field coupling between the node of the first power supply voltage and the node of the power supply voltage supplied to the first circuit becomes smaller, and an induced current flowing to the node of the first power supply voltage and the node of the power supply voltage is reduced by the electromagnetic induction based on the magnetic field, and thereby, fluctuations of the power supply voltage and fluctuations of the first power supply voltage are reduced. Therefore, according to the integrated circuit device, the electromagnetic field coupling and capacitive coupling between the nodes via the terminals are reduced, and an output clock signal having a higher S/N ratio can be output.

In the integrated circuit device according to the aspect, the clock input terminal, the first ground terminal, the first power supply voltage input terminal, the third ground terminal, and the power supply voltage output terminal may be arranged in this order along the first side.

According to the integrated circuit device, the electromagnetic field coupling and capacitive coupling between the nodes via the terminals are reduced, and an output clock signal having a higher S/N ratio can be output.

The integrated circuit device according to the aspect may include an oscillation circuit oscillating a resonator to generate an oscillation signal, a buffer circuit buffering the oscillation signal and outputting the output clock signal, a first resonator terminal coupled to the resonator and the buffer circuit, and a fourth ground terminal disposed between the first resonator terminal and the clock output terminal or between the first resonator terminal and the second power supply voltage input terminal along the second side.

According to the integrated circuit device, the magnetic field generated by the current based on charging and discharging when the output clock signal is output from the clock output terminal is weakened by the magnetic field generated by the current flowing to the ground via the fourth ground terminal. Therefore, the electromagnetic field coupling between the node to which the output clock signal is output and the node coupled to the first resonator terminal becomes smaller, and an induced current flowing to the node coupled to the first resonator terminal is reduced by the electromagnetic induction based on the magnetic field, and thereby, fluctuations of the oscillation signal based on oscillation of the resonator are reduced. Further, the magnetic field generated by the current based on the fluctuations of the oscillation signal and the magnetic field generated by the current based on the fluctuations of the second power supply voltage are weakened by the magnetic field generated by the current flowing to the ground via the fourth ground terminal. Therefore, the electromagnetic field coupling between the node of the second power supply voltage and the node coupled to the first resonator terminal becomes smaller, and an induced current flowing to the node of the second power supply voltage and the node coupled to the first resonator terminal is reduced by the electromagnetic induction based on the magnetic field, and thereby, fluctuations of the oscillation signal based on oscillation of the resonator and fluctuations of the second power supply voltage are reduced. Therefore, according to the integrated circuit device, the electromagnetic field coupling and capacitive coupling between the nodes via the terminals are reduced, and an output clock signal having a higher S/N ratio can be output.

In the integrated circuit device according to the aspect, the second power supply voltage input terminal, the second ground terminal, the clock output terminal, the fourth ground terminal, and the first resonator terminal may be arranged in this order along the second side.

According to the integrated circuit device, the electromagnetic field coupling and capacitive coupling between the nodes via the terminals are reduced, and an output clock signal having a higher S/N ratio can be output.

The integrated circuit device according to the aspect includes a power supply wire coupled to the second power supply voltage input terminal, wherein a shortest distance between the first resonator terminal and the power supply wire may be longer than a shortest distance between the clock output terminal and the power supply wire.

According to the integrated circuit device, the node coupled to the first resonator terminal is a high-impedance node, and noise is easily superimposed thereon, however, the power supply wire from which the second power supply voltage is supplied is provided farther from the first resonator terminal, and noise superimposed on the oscillation signal based on oscillation of the resonator is reduced and an output clock signal having a higher S/N ratio can be output.

The integrated circuit device according to the aspect may include a first power supply wire coupled to the first power supply voltage input terminal, a second power supply wire coupled to the second power supply voltage input terminal, and a shield wire provided between the first power supply wire and the second power supply wire.

According to the integrated circuit device, capacitive coupling between the first power supply wire and the second power supply wire is effectively suppressed by the shield wire, and thereby, the possibility that fluctuations of the first power supply voltage and fluctuations of the second power supply voltage interfere with each other may be reduced and an output clock signal having a higher S/N ratio can be output.

In the integrated circuit device according to the aspect, the first ground terminal is coupled to an external first ground, and the second ground terminal is coupled to an external second ground different from the first ground.

According to the integrated circuit device, the first ground coupled to the first ground terminal and the second ground coupled to the second ground terminal are separated from each other, and thereby, the interference between the reference clock signal input to the clock input terminal and the output clock signal output from the clock output terminal is reduced and the spurious noise superimposed on the output clock signal is further reduced.

An oscillator according to an aspect includes the integrated circuit device according to the aspect.

The oscillator according to the aspect may include a resonator element and a second integrated circuit device oscillating the resonator element and outputting the reference clock signal.

The oscillator according to the aspect may include a temperature control element controlling a temperature of the resonator element.

What is claimed is:

1. An integrated circuit device having a first side and a second side as an opposite side to the first side in a plan view, comprising:
   a clock input terminal disposed along the first side, to which a reference clock signal is input;
   a first power supply voltage input terminal disposed along the first side, to which a first power supply voltage as a source of a power supply voltage supplied to a first circuit that operates at a frequency of the reference clock signal is input;
   a clock output terminal disposed along the second side, from which an output clock signal having a frequency different from that of the reference clock signal is output;
   a second power supply voltage input terminal disposed along the second side, to which a second power supply voltage as a source of a power supply voltage supplied to a second circuit that operates at the frequency of the output clock signal is input;
   a first ground terminal disposed between the clock input terminal and the first power supply voltage input terminal along the first side; and
   a second ground terminal disposed between the clock output terminal and the second power supply voltage input terminal along the second side.

2. The integrated circuit device according to claim 1, further comprising:
   a power supply circuit generating the power supply voltage supplied to the first circuit based on the first power supply voltage;
   a power supply voltage output terminal disposed along the first side and outputting the power supply voltage supplied to the first circuit; and
   a third ground terminal disposed between the power supply voltage output terminal and the first power supply voltage input terminal or between the power supply voltage output terminal and the clock input terminal.

3. The integrated circuit device according to claim 2, wherein
   the clock input terminal, the first ground terminal, the first power supply voltage input terminal, the third ground terminal, and the power supply voltage output terminal are arranged in this order along the first side.

4. The integrated circuit device according to claim 1, further comprising:
   an oscillation circuit oscillating a resonator to generate an oscillation signal;
   a buffer circuit buffering the oscillation signal and outputting the output clock signal;
   a first resonator terminal coupled to the resonator and the buffer circuit; and
   a fourth ground terminal disposed between the first resonator terminal and the clock output terminal or between the first resonator terminal and the second power supply voltage input terminal along the second side.

5. The integrated circuit device according to claim 4, wherein
   the second power supply voltage input terminal, the second ground terminal, the clock output terminal, the fourth ground terminal, and the first resonator terminal are arranged in this order along the second side.

6. The integrated circuit device according to claim 4, further comprising a power supply wire coupled to the second power supply voltage input terminal, wherein
   a shortest distance between the first resonator terminal and the power supply wire is longer than a shortest distance between the clock output terminal and the power supply wire.

7. The integrated circuit device according to claim 1, further comprising:
   a first power supply wire coupled to the first power supply voltage input terminal;
   a second power supply wire coupled to the second power supply voltage input terminal; and
   a shield wire provided between the first power supply wire and the second power supply wire.

8. The integrated circuit device according to claim 1, wherein
   the first ground terminal is coupled to an external first ground, and
   the second ground terminal is coupled to an external second ground different from the first ground.

9. An oscillator comprising the integrated circuit device according to claim 1.

10. The oscillator according to claim 9, further comprising:
   a resonator element; and
   a second integrated circuit device oscillating the resonator element and outputting the reference clock signal.

11. The oscillator according to claim 10, further comprising a temperature control element controlling a temperature of the resonator element.

* * * * *